(12) United States Patent
Singer

(10) Patent No.: US 7,319,509 B2
(45) Date of Patent: Jan. 15, 2008

(54) ATTENUATOR FOR ATTENUATING WAVELENGTHS UNEQUAL TO A USED WAVELENGTH

(75) Inventor: Wolfgang Singer, Aalen (DE)

(73) Assignee: Carl Zeiss SMT AG, Oberkochen (DE)

( * ) Notice: Subject to any disclaimer, the term of this patent is extended or adjusted under 35 U.S.C. 154(b) by 9 days.

(21) Appl. No.: 11/064,594

(22) Filed: Feb. 24, 2005

(65) Prior Publication Data

US 2005/0275818 A1 Dec. 15, 2005

Related U.S. Application Data

(63) Continuation of application No. PCT/EP03/08413, filed on Jul. 30, 2003.

(30) Foreign Application Priority Data

Aug. 26, 2002 (DE) ................................ 102 39 732

(51) Int. Cl.
*G03B 27/72* (2006.01)
*G01D 5/36* (2006.01)
*G02B 5/18* (2006.01)
*G21K 5/00* (2006.01)

(52) U.S. Cl. ................ 355/71; 250/237 G; 250/492.2; 359/569; 378/34

(58) Field of Classification Search ................ 355/53, 355/67, 69, 71; 250/548, 237 G, 492.2; 378/34; 359/569
See application file for complete search history.

(56) References Cited

U.S. PATENT DOCUMENTS

| 6,118,577 | A | 9/2000 | Sweatt et al. ................ 359/351 |
|---|---|---|---|
| 6,233,056 | B1 | 5/2001 | Naulleau et al. ............. 356/520 |
| 6,285,497 | B1* | 9/2001 | Sweatt et al. ................ 359/351 |
| 6,353,470 | B1 | 3/2002 | Dinger ......................... 355/71 |
| 6,438,199 | B1 | 8/2002 | Schultz et al. ................. 378/34 |
| 6,469,827 | B1* | 10/2002 | Sweatt et al. ................ 359/351 |
| 6,522,465 | B1 | 2/2003 | Goldstein .................... 359/361 |
| 6,795,481 | B2 | 9/2004 | Maleki et al. .............. 372/108 |
| 6,867,913 | B2 | 3/2005 | Mann et al. ................. 359/366 |
| 2003/0043455 | A1 | 3/2003 | Singer et al. ................ 359/357 |

FOREIGN PATENT DOCUMENTS

| DE | 10138313 | 8/2002 |
|---|---|---|
| EP | 1202291 | 9/2001 |
| JP | 07301696 | 11/1995 |
| WO | WO0212928 | 2/2002 |

OTHER PUBLICATIONS

Fukuda et al. "Design and Analysis of Diffraction Mirror Optics for EUV Projection Lithography". Microelectronic Engineering vol. 27, 1995, pp. 239-242.

Wilkinson et al. "First-Generation Holographic, Grazing-Incidence Gratings for Use In Converging, Extreme-Ultraviolet Light Beams". Applied Optics vol. 34, 1995, pp. 4685-4696.

(Continued)

*Primary Examiner*—Diane Lee
*Assistant Examiner*—Chia-how Michael Liu
(74) *Attorney, Agent, or Firm*—Ohlandt, Greeley, Ruggiero & Perle, L.L.P.

(57) ABSTRACT

There is provided an attenuator for attenuating electromagnetic radiation of wavelengths Unequal to a used wavelength, including a grating element having i) grating grooves that produce a grating period (p), and ii) a grating plane. The grating period (p) is least about 150 times higher than the used wavelength.

23 Claims, 6 Drawing Sheets

OTHER PUBLICATIONS

PCT International Search Report dated Oct. 20, 2003 from PCT Application No. PCT/EP03/08413 filed on Jul. 30, 2003.

Antoni et al. "Illumination Optics Design for EUV-Lithography". Soft X-ray and EUV Imaging Systems, Proceedings of SPIE vol. 4146 (2000), pp. 25-34.

Ulrich et al. "Trends in Optical Design of Projection Lenses for UV-and EUV-Lithography", Soft X-ray and EUV Imaging Systems, Proceedings of SPIE vol. 4146 (2000), pp. 13-24.

* cited by examiner

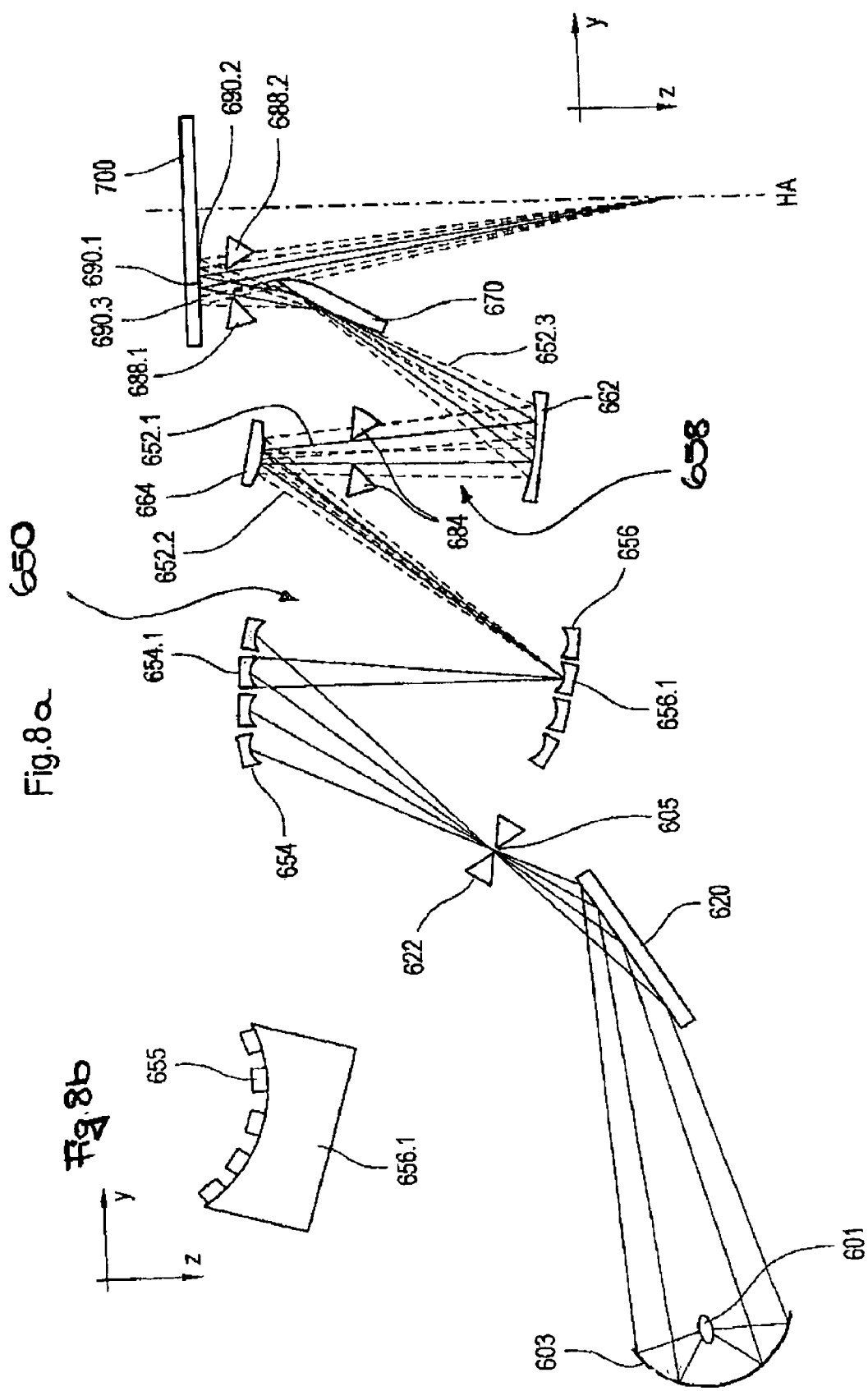

ATTENUATOR FOR ATTENUATING WAVELENGTHS UNEQUAL TO A USED WAVELENGTH

CROSS-REFERENCE TO RELATED APPLICATION

The present application is a continuation of International Patent Application No. PCT/EP2003/008413, filed Jul. 30, 2003, which claims priority of German Patent Application No. 102 39 732.5, filed Aug. 26, 2002, the content of which is herein incorporated by reference.

BACKGROUND OF THE INVENTION

1. Field of the Invention

The invention relates to an attenuator for attenuating wavelengths unequal to a used wavelength. The used wavelength is preferably a wavelength in the wavelength region of $\leq 100$ nm, and especially preferably in the wavelength region which can be used for EUV lithography, i.e. in the region of 11 to 14 nm, especially 13.5 nm.

2. Description of the Related Art

In order to enable a further reduction in the structural widths of electronic components, and in particular in the submicron range, it is necessary to reduce the wavelengths of the light used for microlithography. It is possible to use light with wavelengths of less than 100 nm, e.g. lithography with soft X-rays, i.e. the so-called EUV lithography.

EUV lithography is one of the most promising future lithographic techniques. Currently, wavelengths in the region of 11 to 14 nm, and in particular 13.5 nm, at a numeric aperture of 0.2 to 0.3 are discussed as wavelengths for lithography. The image quality in EUV lithography is determined on the one hand by the projection lens and on the other hand by the illumination system. The illumination system should provide a uniform illumination of the field plane as far as possible in which the structure-bearing mask (i.e. the so-called reticle) is disposed. The projection lens images the field plane in a image plane (the so-called focal or wafer plane) in which a light-sensitive lens is disposed. Projection exposure systems for EUV lithography are equipped with reflective optical elements. The form of the field in the focal plane of an EUV projection exposure system is typically that of a ring field with a high aspect ratio of 2 mm (width)×22 to 26 mm (arc length). The projection systems are usually operated in scanning mode. Reference is hereby made to the following publications concerning EUV projection exposure systems:

W. Ulrich, S. Beiersdörfer, H. J. Mann, "Trends in Optical Design of Projection Lenses for UV and EUV-Lithography" in Soft-X-Ray and EUV Imaging Systems, W. M. Kaiser, R. H. Stulen (Publishers), Proceedings of SPIE, Vol. 4146 (2000), p. 13-24 and

M. Antoni, W. Singer, J. Schultz, J. Wangler, I. Escudero-Sanz, B. Kruizinga, "Illiumination Optics Design for EUV-Lithography" in Soft X Ray and and EUV Imaging Systems, W. M. Kaiser, R. H. Stulen (Publishers), Proceedings of SPIE, Vol. 4146 (2000), p. 25-34 whose scope of disclosure is hereby fully included in the present application.

In the case of illumination systems for wavelengths $\leq 100$ nm there is the problem that the light source of such illumination systems emits radiation which can lead to an undesired exposure of the light-sensitive object in the wafer plane of the projection exposure system and moreover the optical components of the exposure system such as the multi-layer mirrors are heated thereby. In EUV systems at wavelengths of 13.5 nm for example multi-layer mirrors are used which perform a spectral filtering in the region about the EUV wavelengths, but reflect the incident radiation again with higher reflectivities from 130 nm for example. The radiation in the DUV wavelength region in particular, i.e. wavelengths in the region of 130 nm-330 nm, leads to such exposures of the light-sensitive object in the wafer plane. Radiation in the close UV region, in the visible or infrared region, i.e. wavelengths above 330 nm, lead to a heating of the mirrors.

For filtering out or attenuating this undesired radiation transmission filters made of zirconium for example are used in illumination systems for wavelengths $\leq 100$ nm. Such filters or attenuators have the disadvantage of high losses of light. Moreover, they can easily be destroyed by heat loads.

As an alternative, it is possible to provide the filtering with grating elements according to the concept of conventional spectral filtering. In such a method, the grating period of the grating element is chosen in such a way that the radiation of the used wavelength is diffracted in the first order. With the help of a diaphragm downstream of the grating element in the beam path it is then possible to filter out especially the light of the $0^{th}$ diffraction order which comprises a considerable amount of radiation with wavelengths which do not correspond to the used wavelength by blocking radiation of the $0^{th}$ diffraction order. The radiation of the used wavelength of 13.5 nm for example is then diffracted substantially completely in the $1^{st}$ order and allowed to pass completely to the following illumination system by the diaphragm downstream in the beam path.

The advantage of such a spectral filter is that is at least a theoretical possibility to completely surpress or block undesirable wavelengths. As a result of such an arrangement it is possible to block substantially complete the undesired DUV radiation which designates radiation in the wavelength region of 130 nm to 330 nm. Such a filter element in an EUV illumination system is shown in EP-A-1 202 291 and copending U.S. patent application US 2002/0186811 A1, whose scope of disclosure is hereby fully included in the present application.

The grating elements which are described in EP-A-1 202 291 and copending U.S. patent application Ser. No. 2002/0186811 A1 particularly provided as echelle gratings have the disadvantage that they show a total efficiency of less than 60% and place high demands on the production of the grating. As a result, the grating must have an optical functionality, for example must have optical power, so that the formation of the $1^{st}$ diffraction order can occur to a certain extent in an aberration-free way at the used wavelength.

The behaviour in diffraction gratings as are known from EP-A-1 202 291 and copending U.S. patent application US 2002/0186811 A1 are described by the grating equation $$n\frac{\lambda}{p} = \sin\alpha_i - \sin\beta \quad (1)$$

with the grating period p, the diffraction order n, the angle of incidence aI relating to the surface normal of the grating, the angle $\beta$ of the diffraction ray relating to the surface normal of the grating and the wavelength $\lambda$.

The grating element as described in EP-A-1 202 291 and copending U.S. patent application US 2002/0186811 A1 are suitable in an illumination system for wavelengths $\leq 200$ nm for spectral filtering in the case that the individual diffraction orders and the wavelengths are clearly separated from each other. This is achieved by a sufficiently large diffraction angle between the $0^{th}$ order and a $1^{st}$ order, e.g. with a diffraction angle $\gamma=\beta-\alpha_i>2°$. The diffraction at a wavelength of 13.5 nm for example by a larger diffraction angle $\gamma$ of $\gamma>2°$ for example is achieved in such a way that the grating grooves are aligned virtually perpendicular to the plane of incidence of the radiation and the grating is used under grazing incidence, i.e. the angle of incidence ax is larger than 70° relative to the surface normal of the surface. Grating periods of 500 l/mm to 1000 l/mm are thus sufficient for example. The plane of incidence is defined as the plane which is defined by the incidence vector and the normal vector of the grating surface where the incident beam pierces the grating surface. The grating vector which is situated perpendicular to the grating grooves in the tangential plane at the grating surface therefore nearly lies in the plane of incidence. If the grating vector is situated in the plane of incidence, the vector equation of the grating diffraction can be reduced to the above equation (1).

A disadvantage of the known spectral filters or attenuators is that in the case of thin films they can be destroyed by the thermal load and show only a very low efficiency in transmission. If gratings as described in EP-A-1 202 291 are used as filters or attenuators, it is possible that the DUV radiation can be blocked in particular. There is a disadvantage however that there is a very low efficiency in the region of EUV wavelengths. The maximum achievable efficiency of such gratings in the region of EUV wavelengths is only 35% to 50%.

SUMMARY OF THE INVENTION

It is thus the object of the present invention to overcome the disadvantages of the state of the art and to provide an attenuator or spectral filter in particular which can suppress the undesirable radiation, but which shows a substantially higher efficiency than previously known solutions in order to enable lower power requirements for the employed light source.

This object is solved in accordance with the invention in that an attenuator is provided which comprises at least one grating element, with the grating comprising grating grooves producing at least one grating periodicity and the grating periodicity being much larger than the used wavelength, i.e. in the case of EUV radiation very much larger than the used wavelength of 13.5 nm.

The inventors have recognized surprisingly that in order to avoid damage to the optical components, and the mirrors in particular, and in order to avoid undesirable exposure to the light-sensitive substrate by wrong wavelengths in the DUV region for example, it is not necessary to completely suppress undesirable wavelengths in the region of DUV radiation and/or infrared radiation, but that it is sufficient to attenuate this radiation in relationship to the radiation of the used wavelength. Depending on the spectral characteristics of the light source, an attenuation of certain wavelength regions by 20% relative to the used wavelength can be sufficient for example.

The filtering or attenuation of the undesirable wavelengths in the DUV or IR region with the attenuator in accordance with the invention is achieved in such a way that the $0^{th}$ diffraction order is used instead of in a $1^{st}$ diffraction order for example of a grating element as disclosed in EP-A-1 202 291 in an illumination system in which an attenuator in accordance with the invention is used and the undesirable long-wave radiation is diffracted away to orders other than the $0^{th}$ order due to the grating period of the grating element which is much larger than the wavelength of the used light. If a diaphragm with a diameter of slightly larger than the $0^{th}$ diffraction order is attached near the $0^{th}$ order, all higher diffraction orders which contain radiation with longer wavelengths can be blocked.

Preferably, the attenuator in accordance with the invention is used in an illumination system, e.g. a EUV illumination system, with a used wavelength of 13.5 nm for example. The diaphragm around the $0^{th}$ order is disposed in such an illumination system preferably in a beam focus, for example in a first image of the source. It is also possible to deflect the undesired radiation in the illumination system in such a way that the higher diffraction orders come to lie next to the field to be illuminated. The undesired radiation can be blocked in such a case by a field diaphragm. A field diaphragm consists of one or several diaphragms in or close to the field plane which only allow the radiation to pass to the illuminated field. The edge of the mirror per se can act as a diaphragm that blocks undesired radiation because the edge of the mirror can preferably be designed in such a way as is required for a complete illumination of the field to be illuminated.

Due to the fact that the undesired long-wave radiation can be diffracted away at least partially into diffraction orders other than the $0^{th}$ diffraction order, radiation in the DUV and/or infrared region can be attenuated substantially in an illumination system by blocking the diffracted radiation by means of a diaphragm for example.

Preferably, the grating periodicity of the grating in accordance with the invention is more than 150 times the used wavelength, especially preferably more than 200 times the used wavelength. Moreover, the attenuator in accordance with the invention can be operated both under grazing incidence as well as under normal incidence. In this application grazing incidence is understood in such a way that the rays of a beam bundle which impinges on the grating have an incidence angle $\alpha_i>70°$ relative to the normal of the surface of the grating. In the case of grazing incidence the grating vector of a grating preferably stands virtually perpendicular to the incidence plane of the grating, with the incidence plane being defined by the incident ray and the normal of the surface.

Normal incidence is understood in such a way that the rays of a beam bundle which impinges on the grating have an incidence angle $\alpha_i<30°$ relative to the normal of the surface of the grating.

The diffraction angle $\gamma=\beta-\alpha_i$ can be calculated in an approximate manner by equation (2) both in the case of gratings whose grating vector lies virtually perpendicular to the incidence plane as well as when using gratings under virtually perpendicular incidence, i.e. incidence angles of $\alpha_i<30°$ relative to the normal of the surface and at small diffraction angles:

$$\sin(\gamma) \approx \frac{\lambda}{p} \quad (2)$$

Equation (2) is for grazing incidence an approximation because one is situated in the zone of the so-called conical diffraction for a grating with a grating vector which stands perpendicular to the incidence plane, which means that the grating grooves are oriented parallel to the incident ray. The diffraction orders then lie on a conical surface.

Since the used light is not diffracted away in the attenuator or grating element in accordance with the invention but uses the same in the $0^{th}$ order, the grating element does not have any optical effect on the used wavelength. This is because in the $0^{th}$ order of the grating element the optical properties of the carrier surface to which the grating element is applied do not change substantially. As a result, the grating can be applied without any disadvantages to a curved surface. As a result of the low-frequency grating of the attenuator in accordance with the invention, the used wavelength is deflected according to equation (2) at a period p of approx. 4 μm into the +/−$1^{st}$ order by only γ(13.5 nm)≈0.2° with respect to γ(130 nm)≈2° for the disturbing wavelength of 130 nm. In a further example the deflection occurs into the $1^{st}$ order for example only by approx. 0.2 mrad at 13.5 nm, but by approx. 2 mrad at 130 nm. As a result of the ray that is diffracted away in the first example by approx. 2° or in the second example by 2mrad into the +/−$1^{st}$ order, it is possible, by introducing a diaphragm in the path of rays downstream of the attenuator for example, to attenuate the undesirable radiation at 130nm in an illumination system for example.

The operation of an attenuator with at least one grating element in the $0^{th}$ diffraction order for the used wavelength further has advantages in production. For example it is therefore irrelevant whether the grating is made from one piece or is made in segments. Moreover, the grating can comprise conically tapered grating grooves in the case that the grating is used in a converging path of rays of an illumination system. This arrangement can be chosen optionally and has an influence merely on the position and blurring of the diffraction orders in which the disturbing light is diffracted. This is virtually without any relevance whatsoever for the light in the $0^{th}$ diffraction order which also contains the light for the used wavelength.

The grating element in accordance with the invention is thus very insensitive to production faults.

The grating in accordance with the invention is especially preferably designed as a so-called binary grating which has only two different heights, e.g. a first height $H_1$=0 relating to the local coordinate system and a second height $H_2$=h. The zones of different height can be chosen equally wide for example and thus half as wide as the grating period p. The ratio of the two widths of the differently high zones is also known as aspect ratio. In the case of binary gratings with equally wide structures of different height there is thus an aspect ratio of 1. It is also possible to choose the widths differently, so that the period is obtained in the sum total of the widths of the two differently high zones with the heights $H_1$ and $H_2$. The diffraction efficiency can be influenced in the different diffraction orders through the variation of the structural widths, i.e. the aspect ratio.

One advantage of binary gratings is the edge steepness. Due to the steepness of the edges, the shadings are low in a binary grating when it has a periodicity perpendicular to the incidence plane. Perpendicular to the incidence plane means in this case that the grating vector stands virtually perpendicular to the incidence plane. As a result of this arrangement of the grating grooves parallel in the direction of the incident ray, i.e. in the incidence plane, it is possible to achieve especially under grazing incidence at relatively high grating structures that the shadings and thus the light loss for the used wavelength is low. The grating is then substantially invisible for the used wavelength.

The diffraction efficiency of such a binary grating element will attain a maximum when the following applies for the depth of the grating:

$$h_n^\lambda = \left(\frac{2n+1}{2}\right) \cdot \frac{\lambda}{2\cos\alpha_i} \quad n = 0, 1, 2, 3 \ldots \quad (3)$$

with $h_n^\lambda$ being the grating depth for maximum diffraction efficiency at wavelength $\lambda$ and the incidence angle $\alpha_i$ relating to the normal of the surface and n an integer number. If in a preferred embodiment the grating element is designed as a binary grating with only two heights, namely a first height and a second height, the diffracted light distributes substantially between $0^{th}$ and +/−$1^{st}$ diffraction order. If $h=h_{\lambda 1}$ according to equation (3), approx. 80% of the light is diffracted into the the+/−$1^{st}$ diffraction order for wavelength $\lambda 1$, e.g. $\lambda 1$=130 nm. Accordingly, only an amount of light intensity of this wavelength $\lambda 1$ of less than 20% remains in the $0^{th}$ diffraction order. In order to consider the relative attenuation with respect to the EUV radiation, it is necessary to consider the reflectivity of the attenuator for the EUV radiation at 13.5 nm for example. Under grazing incidence for example at an incidence angle $\alpha_i$ of 76° relative to the normal of the surface with a ruthenium coating, reflectivities of over 80% are achieved, i.e. the desired EUV radiation is also attenuated by 20%. If this is taken into account, it is possible to achieve for the wavelength $\lambda 1$ an attenuation by 80% (DUV, i.e. 130 nm) to 20% (at EVU, i.e. 13.5 nm), i.e. of 75% relative to the $\lambda$=13.5 nm. Through equation (3) the depth of the grating can be chosen in such a way that certain wavelengths are substantially diffracted out of the beam. Advantageously the depth $h_n$ is chosen in such a way that in the $0^{th}$ order undesirable DUV and IR wavelengths are diffracted into the the +/−$1^{st}$ order.

It is understood that the condition (3) will possibly also be fulfilled for the used wavelength $\lambda$=13.5 nm. However, the diffraction angle is very low at 13.5 nm in higher orders, e.g. the ±$1^{st}$ order for a grating which is constructed to be efficient and thus diffracts light with wavelengths in the DUV region. Such a grating comprises a periodicity p=4 μm and a grating depth of 210 nm for example. For such gratings light of the used wavelength of 13.5 nm which is diffracted into the the ±$1^{st}$ order comes to lie so close to the $0^{th}$ order that this has an effect merely as a slight blurring of the $0^{th}$ order.

On the other hand, the grating with the depth $h_n$ has another effect at another wavelength and at depths $$h'_m = m \cdot \frac{\lambda}{2\cos\alpha_i} \quad m = 0, 1, 2, 3 \ldots \quad (4)$$

there is virtually no diffraction any more, i.e. the entire light with wavelengths which fulfill this condition cannot be diffracted into another diffraction order and moves to the $0^{th}$ diffraction order and thus to the specular reflex.

Generally, the diffraction efficiency η can be expressed by a simple formula depending on the depth of a binary grating and the wavelength:

$$\eta(h, \lambda) = c_m \cdot \sin^2\left(\frac{2\pi}{\lambda} h \cos\alpha_i\right) \quad (5)$$

with h being the depth of the grating and $c_m$ the maximum diffraction efficiency in the desired diffraction order, i.e. approx. $c_{-1} \approx 40\%$ for the $-1^{st}$ diffraction order and $c_1 \approx 40\%$ for the $+1^{st}$ diffraction order, in total for both diffraction orders approx. $c_{-1} + c_1 \approx 2c_1 \approx 80\%$. The diffraction efficiency can be dependent on the material properties and additionally depend on the wavelength or the reflectivity of the used grating material at the respective wavelengths.

As will become clear from the above discussion, the grating element in accordance with the invention can be used to diffract various wavelengths only to certain amount out of the $0^{th}$ order. On the average only approx. 50% of the maximum diffraction efficiency $2c_1$ can be reached over a specific spectral region, i.e. approx. only 40% of the disturbing radiation can be filtered out. Through a proper choice of the depth it is possible to achieve an optimal suppression of especially strongly occurring disturbing wavelengths.

As shown above, the attenuator in accordance with the invention can filter out at most 80% of the intensity of a undesirable DUV radiation at certain wavelengths. At other wavelengths the grating does not work for example. The grating is therefore preferably designed in such a way that in the DUV region several strongly occurring and disturbing wavelengths are filtered out virtually completely. In order to achieve this, the grating depth h is provided in an advantageous embodiment in such a way that the condition (3) is fulfilled for the highest possible number of wavelengths. In a further, particularly advantageous embodiment the grating depth h is chosen in such a way that the mean diffraction efficiency assumes a maximum in the desired spectral region.

On the average over all DUV wavelengths it is possible to achieve a mean diffraction efficiency of approx. 40% and thus an attenuation of this undesirable radiation by the same amount. On the other hand, the reflectivity for the used wavelength of e.g. $\lambda = 13.5$ nm is approx. 80% when in a preferred embodiment a ruthenium coating is used and the grating is used under grazing incidence, i.e. the rays of the beam bundle impinge under an angle of <20° relative to the surface tangent or an angle of $\alpha_i > 70°$ relative to the normal of the surface. With such a grating element as an attenuator it is possible to reduce the amount of undesired DUV-wavelengths by 25% for example. In a particularly advantageous embodiment a mean diffraction efficiency of approx. 68% is achieved by a optimisation of the depth to approx. 210 nm at an angle of incidence of 76° relative to the normal of the surface for wavelengths of the DUV spectral region of 130 nm to 330 nm. This corresponds to an attenuation of the amount of undesired radiation in the DUV-wavelengths-region by 60%. Since the diffraction efficiency is substantially independent of the grating period, this applies to several grating periods and can be used in an analogous way for attenuator in accordance with the invention which are used under normal incidence angles. Such modifications are obvious to a person skilled in the art.

In order to achieve a even higher suppression of radiation in the DUV-wavelengths-region, the principle of the invention can be used several times successively in a preferred embodiment, e.g. under multiple reflection under grazing incidence or even on normal incidence mirrors, which are mirrors on which the rays of the beam or rays impinge under an angle of of $\alpha_i > 20°$ relative to the surface tangent or of <70° relative to the normal of the surface.

Preferably, the grating grooves are designed in a conical way (i.e. in a tapered manner) in the converging path of the rays and under grazing incidence. At small aperture angles this is not mandatorily required. The complete grating can also be designed as a single large binary grating with the same period if smaller shadings are acceptable.

Instead of grating grooves that taper, the grating can also be realized by individual segments which are oriented in a respective fashion with respect to the local angle of incidence of the converging beam bundle. The grating periods of the individual segments can differ in addition.

In a converging path of rays the angle of incidence a, changes over the grating. As a result, the wavelength also changes via the grating for which equation (1) achieves the highest diffraction efficiency.

In an especially advantageous embodiment, the grating depth can also vary over the grating instead of individual grating elements with different grating depths which are arranged several times behind one another, e.g. by segmentation or by a production method with which the course can be set.

BRIEF DESCRIPTION OF THE DRAWINGS

The invention is now explained for example by reference to an embodiment and the drawings. The drawings show:

FIG. 8a shows a projection exposure system with a grating element in accordance with the invention on a normal incidence mirror;

FIG. 8b shows a normal incidence mirror with a grating.

DESCRIPTION OF THE INVENTION

Figure 1:
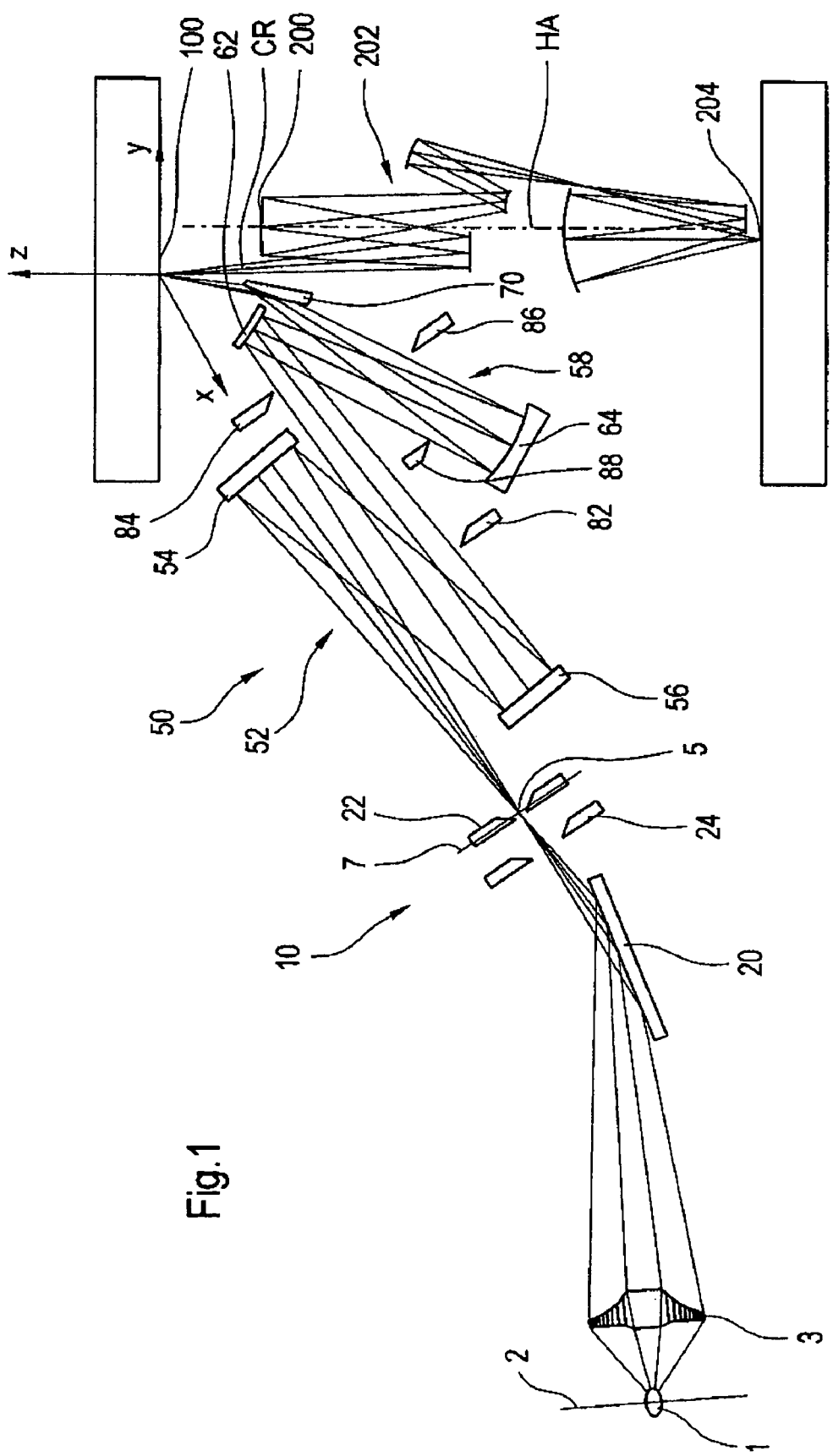
FIG. 1 shows an EUV projection exposure system with an attenuator in form of a grating element in accordance with the invention.

FIG. 1 shows an EUV projection exposure system with a grating element in accordance with the invention. The EUV projection exposure system comprises a light source 1, a focusing optical component, a so-called collector 3 which is arranged as a nested collector according to German patent application DE 101 38 313 A1 and the copending U.S. patent application Ser. No. 2003-0043455 A1 as filed on Jan. 23, 2002 with the United States Patent Office for the applicant, the scope of disclosure of which is hereby fully included in the present application. The collector 3 projects the light source 1 situated in the object plane of the illumination system to a picture of the light source 5 or a so called secondary light source in or close to a diaphragm plane 7.

In the present case, the light source 1, which can be either a laser-plasma source or a plasma-discharge source, is situated in the object plane 2 of the illumination system. The picture of the primary light source 1 comes to lie in or close to the diaphragm plane 7 of the illumination system 10. The picture of the primary light source is also designated as secondary light source 5.

An additional diaphragm 24 is arranged between the attenuator 20 in accordance with the invention with at least one grating element and the physical diaphragm 22 in the diaphragm plane 7. In accordance with the invention, the focus of the $0^{th}$ order comes to lie in the plane 7 of the diaphragm 22, i.e. the light source is projected by the collector and the attenuator in the $0^{th}$ diffraction order in a virtually stigmatic way to the plane of the diaphragm and leads to the secondary light source 5 there. All other diffraction orders such as $+1^{st}$ or $-1^{st}$ diffraction order are blocked by the diaphragms 22 and 24 for light of longer wavelength, e.g. light or radiation of longer wavelengths. Due to the low deflection angle of the used radiation in higher diffraction orders, e.g. in the $\pm 1^{st}$ diffraction order, this light is generally not blocked by the diaphragm. Instead, a blurring of light of the used wavelength occurs close to the $0^{th}$ diffraction order. The deflection to other diffraction orders is not shown in FIG. 1. In this respect, reference is made to FIG. 3.

The illumination system of the projection system further comprises an optical system 50 for shaping and illuminating the field plane 100 with a ring-shaped field, as described in the U.S. Pat. No. 6,438,199 B1, whose scope of disclosure is hereby fully included in the present application. The local x,y,z coordinate system is depicted in the field plane 100. The optical system 50 comprises two faceted mirrors, which are in refractive systems also called fly eye's lenses, 54, 56 as a mixing unit 52 for the homogeneous illumination of the field in the field plane 100. Furthermore the illumination system comprises a projection lens 58 with two projecting mirrors 62, 64 in addition to the mixing unit 52 and a field-forming grazing-incidence mirror 70. Additional diaphragms 82, 84, 86, 88 for suppressing spill light are arranged in the optical system.

The first faceted mirror 54, the so-called field facet mirror, produces a plurality of secondary light sources in or close to the second faceted mirror 56, the so-called pupil facet mirror. The following projection lens 58 projects the pupil facet mirror to the exit pupil of the illumination system which comes to lie in the entrance pupil 200 of the projection lens 202. The entrance pupil of the projection lens 200 is given by the point of intersection of the main beam CR with the optical axis HA of the projection lens 202. The angle of inclination of the individual facets of the first facet mirror 54 and the second facet mirror 56 are designed in such a way that the images of the individual field facets of the first facet mirror substantially overlap in the field plane 100 of the illumination system and thus a substantially homogenized illumination of the structure-bearing mask which comes to lie in this field plane is enabled. The segment of the ring field is formed via the field-forming grazing-incidence mirror 70 which is operated under the grazing incidence.

The structure-bearing mask which is disposed in the field plane 100 and is also designated as reticle is projected by a projection lens 202 into the image plane 204 of the field plane 100. The projection lens is a six-mirror projection lens as filed with the U.S. application Ser. No. 60/255214 on 13 Dec. 2000 with the US Patent Office on behalf of the applicant or as disclosed in U.S. Pat. No. 6,353,470, the scope of disclosure of which is hereby fully included in the present application.

The object to be exposed such as a wafer is disposed in the image plane 204 of the projection lens.

Figure 2:
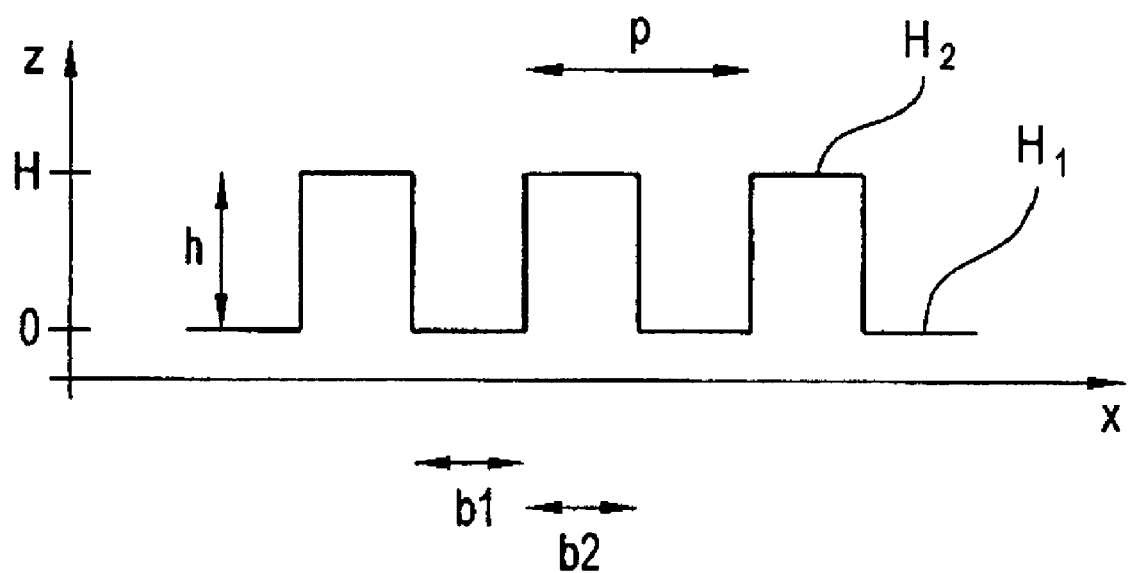
FIG. 2 shows the heights along the x direction of an attenuator in accordance with the invention.
Figure 3:
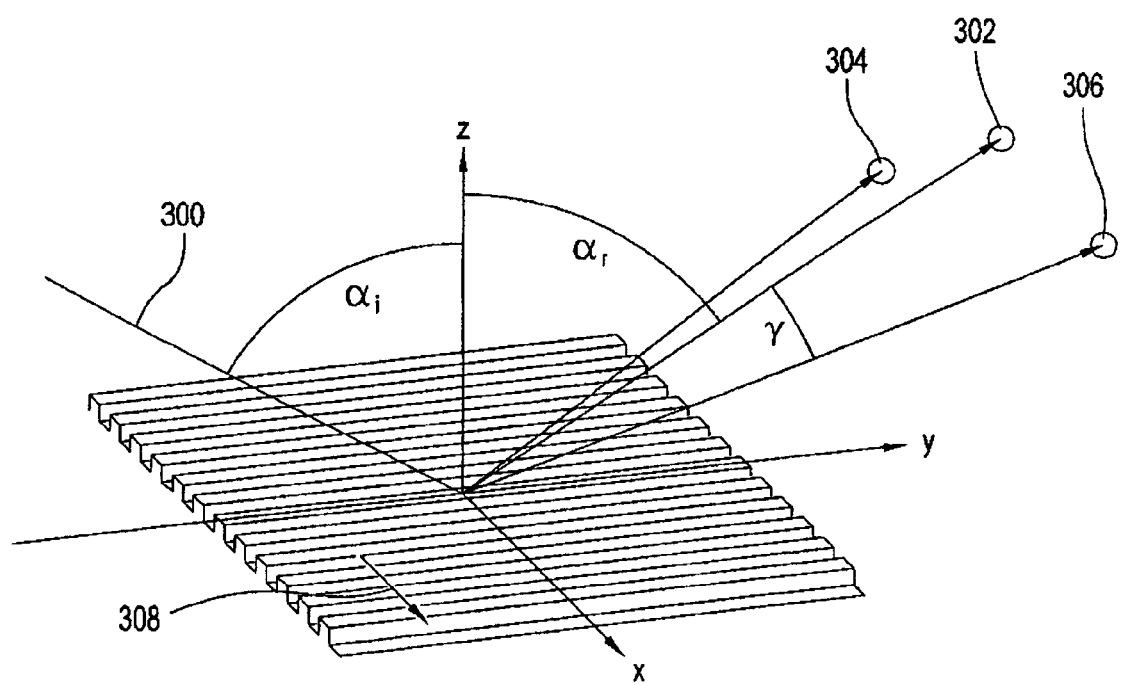
FIG. 3 shows a three-dimensional arrangement of an attenuator with coordinate system in accordance with the invention.

FIG. 2 shows a sectional view in the x-z direction through an attenuator in accordance with the invention with at least one grating element. A three-dimensional schematic view of such an attenuator is shown in FIG. 3. The sectional view is perpendicular to the direction of incidence of the rays of a beam bundle impinging on the grating element. The periodic height profile H(z) of the grating element is shown. The attenuator in accordance with the invention comprises a binary grating element as a grating element which comprises a first height $H_1$ and a second height $H_2$. The difference between the first height $H_1=0$ and the second height $H_2=H$ is the groove depth. In the present case the groove depth is $h=H-0=H$ as shown in FIG. 3. The periodicity of the grating element arising from the course of the height in the x direction is designated with p. The width of the structure with height $H_1=0$ being designated with b1 and the width of the structure with height $H_2=H$ with b2. The period is obtained from the sum total of b1+b2=p. In the present illustrated case b1=b2. Then the aspect ratio is b1/b2=1. Other aspect ratios are also possible.

If for example the light in the DUV wavelength region of 130 nm is to be diffracted by $\gamma=2°$ in a $+_1^{st}$ or $-1^{st}$ order, one requires a grating period p of approx. 3.7 μm. EUV radiation which is also diffracted by such a grating into higher orders, e. g. into the $\pm 1^{st}$ order is diffracted by only and therefore 0.2° —as explained above—only leads to a slight blurring of the secondary light source 5 in the plane 7.

FIG. 3 shows an attenuator in accordance with the invention in a three-dimensional representation. The local x, y, z coordinate system is also shown. The grating grooves are oriented in the y direction, i.e. parallel to the direction of the impinging rays of a beam bundle. The grating vector 308 which is situated in the tangential plane to the grating stands perpendicular to the grating grooves and therefore faces in the x direction. From the plurality of rays of a beam bundle impinging the grating a representative beam 300, e.g. the principle or the chief ray of a beam bundle is shown which impinges upon the grating surface. The ray 300 impinges on the grating element under an incidence angle $\alpha_i$ relative to the normal line of the surface 302. The incidence angle $\alpha_i$ is larger than 70°. The normal line 302 of the surface coincides with the z direction. The impinging ray 300 and the normal line 302 define the local incidence plane which in the present case coincides with the y-z plane. The ray of the beam bundle deflected into the $0^{th}$ order is designated with 302, the rays diffracted into the $+1^{st}$ and $-1^{st}$ order with 304 and 306. When using such a grating in which the grating vector stands perpendicularly to the incidence plane, the diffracted rays do not lie in the incidence plane. Merely the $0^{th}$ order which corresponds to the reflected ray comes to lie in the incidence plane. The other diffraction orders are deflected in the direction towards the grating vector and in the height. In this case one speaks of conical grating diffraction.

Figure 4:
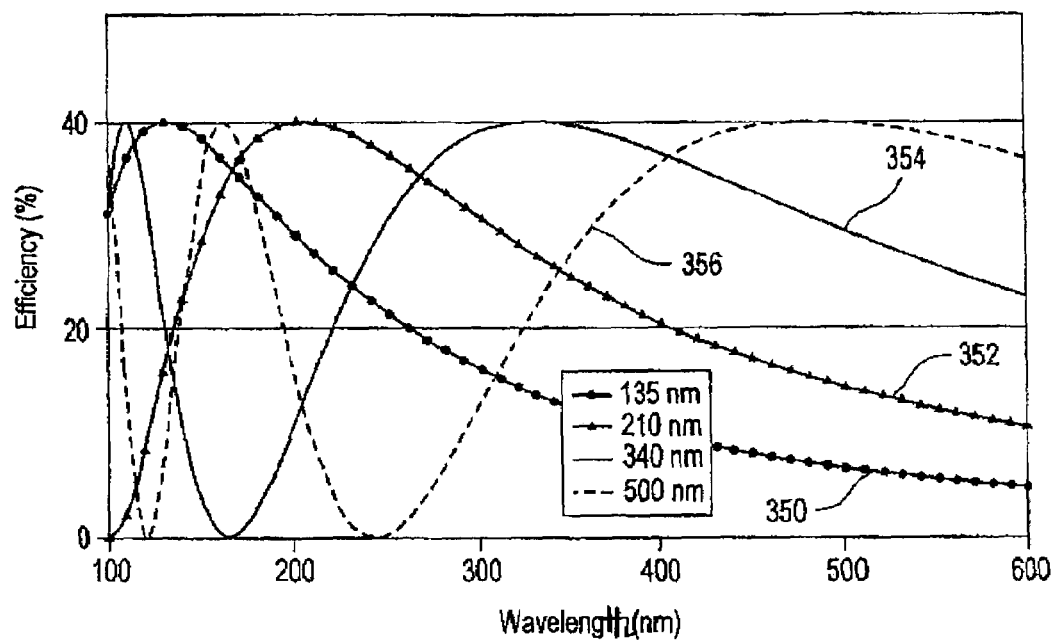
FIG. 4 shows the diffraction efficiency over the wavelength for a given grating depth.

FIG. 4 shows the shape of the diffraction efficiency $\eta(h,\lambda)$ for one of the two $1^{st}$ diffraction orders according to equation (5) over the wavelength λ for four different grating depths of 135 nm, 210 nm, 340 nm and 500 nm at an incidence angle of $\alpha_i=76°$. Binary gratings are assumed. The following reference numerals are used: for a grating depth of 135 nm reference numeral 350, for a grating depth of 210 nm reference numeral 352, for a grating depth of 340 nm reference numeral 354, for a grating depth of 500 nm reference numeral 356. At a low grating depth of h=210 nm (curve 352) for example only one diffraction maximum is situated at approx. λ≈200 nm in the DUV spectral region. If a larger grating depth of h=340 nm (curve 354) for example is chosen, the maximum diffraction efficiency is achieved according to equation (5) for the wavelengths λ≈110 nm and λ≈330 nm. For the wavelength λ≈330 nm and a number of shorter wavelengths, e.g. a third of said wavelength at λ≈110 nm, a maximum diffraction efficiency of approx.≈40% is achieved in the two $1^{st}$ diffraction orders, i.e. for said wavelengths approx. 80% are diffracted out of the $0^{th}$ order and thus filtered out. For the wavelengths between said ideal wavelengths a $\sin^2$-like shape of the diffraction efficiencies is obtained approximately, i.e. for other wavelengths the intensity of the DUV radiation located in the $0^{th}$ order is only attenuated or the grating will not have any effect at all, e.g. for the depth of h=340 nm at the wavelength λ≈165 nm. The amount and the wavelength of the suppressed or transmitted DUV-radiation can be thus determined by depth of the grating. If sources provide a evenly distributed DUV spectrum or a unknown spectral distribution of radiation the grating depth h is best chosen in such a way that over a spectral region to be suppressed a maximum for the diffraction efficiency according to equation (5) or FIG. 4 as averaged over said spectral region is provided.

Figure 5:
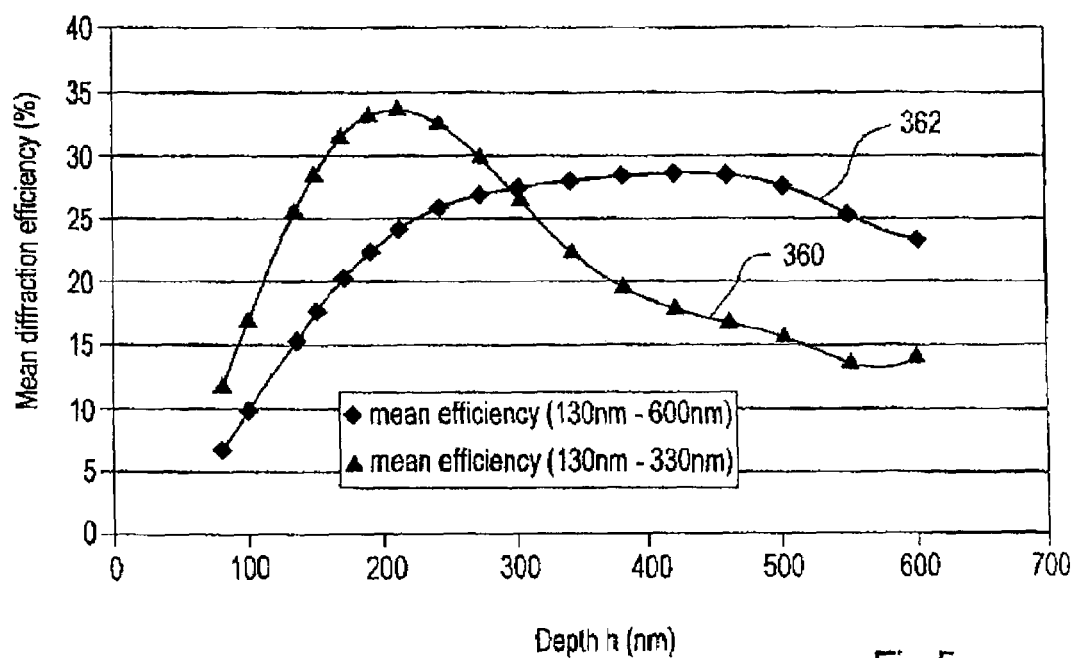
FIG. 5 shows diffraction efficiency averaged over a spectral region depending on the grating depth.

FIG. 5 shows the mean diffraction efficiency $\eta_{mittel}$ over two spectral regions, namely for the DUV spectral region from 130 nm to 330 nm (reference numeral 360) and for a broader wavelength region from 130 nm to 600 nm (reference numeral 362), depending on the grating depth at an incidence angle of $\alpha_i=76°$. The shape of the curve is obtained by averaging the diffraction efficiencies according to equation (5), i.e.

$$\eta_{mittel} = \frac{\int_{\lambda_{min}}^{\lambda_{max}} \eta(h,\lambda)P(\lambda)\,d\lambda}{\int_{\lambda_{min}}^{\lambda_{max}} P(\lambda)\,d\lambda} \quad (6)$$

with $\eta(h,\lambda)$ representing the diffraction efficiency according to equation (5), h the grating depth, $\lambda_{min}$ the shortest wavelength and $\lambda_{max}$ the longest wavelength of the wavelength region to be averaged, and $P(\lambda)$ the spectral distribution which impinges on the attenuator. In the present simplified example $P(\lambda)$ is set constant to equal 1 without any limitation to the generality thereof.

The shape $\eta(h,\lambda)$ is shown in FIG. 4 for four examples over the considered spectral region. When examining the spectral region, the maximum mean diffraction efficiency according to equation (6) of FIG. 5 can be found at a grating depth of approx. 210 nm. The averaged diffraction efficiency is in this case≈34%. In both $1^{st}$ diffraction orders 68% of the radiation is diffracted out with a wavelength between 130 nm and 330 nm. A maximum of 32% of the undesired radiation then remains in the $0^{th}$ order. If this is compared with the reflectivity of ruthenium of at least 80% for the used wavelength of 13.5 nm, one obtains a transmission of the undesired DUV radiation of 32%: 80%≈40%, i.e. a relative suppression of 60% of the undesired radiation. For the broader spectral region of 130 nm to 600 nm an ideal groove depth is found at approx. h≈420 nm. The mean diffraction efficiency is then approx. ≈29%, which leads to a suppression of the respective spectral region by more than approx. ≈ 47%.

Figure 6A:
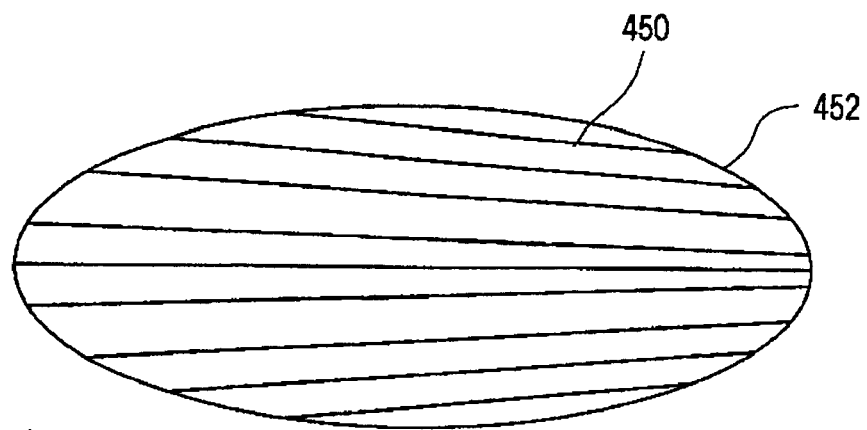
FIG. 6a shows the grating element with conical grating lines.
Figure 6B:
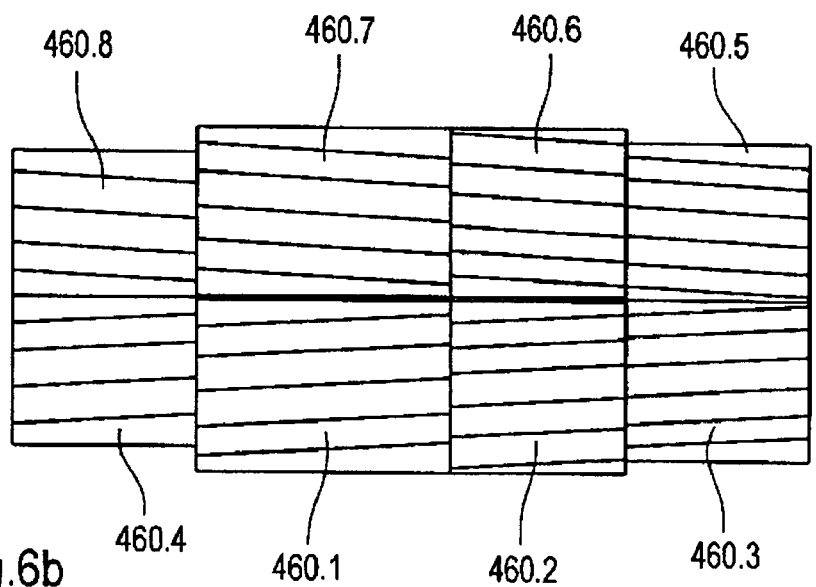
FIG. 6b shows the grating element consisting of a large number of individual segments.

FIG. 6a shows the arrangement of the grating grooves 450 for a beam bundle impinging in a converging manner on the attenuator in accordance with the invention under a grazing incidence of e.g. of $\alpha_i=76°$. The grating grooves are always aligned ideally parallel to the local plane of incidence. As is shown above, the local plane of incidence is defined by the respective impinging ray of the beam bundle and the normal vector of the surface. The normal vector of the surface stands perpendicular to the grating plane. The focal point of the converging beam lies in this case to the right of the grating. All grating grooves 450 point to said focal point. For the functionality of the attenuator in accordance with the invention it is not absolutely necessary that the grating consists of conically tapered grating grooves. Especially in the case of small apertures of up to NA≈0.2 the grating can also be composed of virtually parallel grating grooves, as is shown in FIG. 3. This is simpler from a production viewpoint. As is shown in FIG. 6b, the grating can also be composed of segments 460.1, 460.2 of the same grating period.

Figure 7:
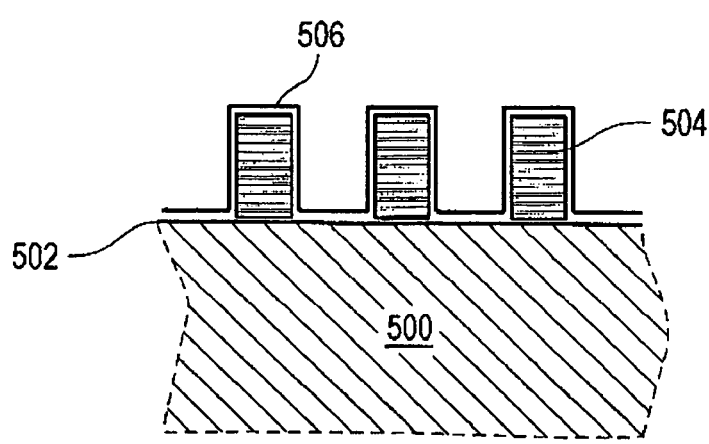
FIG. 7 shows the layer structure of an attenuator in accordance with the invention in an x-z sectional view.

FIG. 7 schematically shows the detailed arrangement of an attenuator in accordance with the invention in an x-z sectional view on the basis of a grating element. A stop layer 502 is applied at first onto a substrate 500. The substrate 500 can be made of silicon for example. A material 504 is applied onto the stop layer 502. The material is then structured, e.g. by known etching techniques. The stop layer 502 is used for the purpose that the etching process comes to an end and does not move forward to the substrate 500. In order to increase the reflectivity in the EUV region the etched structure is provided with a coating 506 which reflects a high amount of the EUV radiation. Such a coating can be ruthenium or a multi-layer made of molybdenum and silicon for example. Both the stop layer as well as the material applied onto the stop layer have the advantage that they can be processed with a very high surface quality. In order to ensure a high reflectivity under grazing incidence for example of $\alpha_i>70°$ the grating must show a very low roughness around rms ~0.6 nm. The following method is therefore recommended for production:

At first a plane substrate 500 with the stop layer 502 is polished. Then the substrate is coated with a layer 504. The layer 504 is an etchable layer of a certain thickness. A certain layer thickness can be provided by finishing, e.g. lapping of the surface. This etchable layer can be structured by means of photolithographical techniques.

Since both the etchable layer as well as the substrate can be polished very well, a small roughness can be achieved. The etchable layer can be removed right up to the substrate by directional etching, e.g. by means of ion beaming of the etchable layer at the places not protected by resistant or protective layers. A grating with a well-controlled depth of the grating grooves can then be produced. FIG. 8a shows a further embodiment of a projection exposure system with an attenuator in accordance with the invention in a schematic representation. The attenuator in this embodiment is attached to the mirrors which are operated under small incidence angles. In this case the attenuator is attached to pupil facets 656 of the illumination system. The illumination system comprises a collector 603 which projects the light source 601 to a first image of the light source 605. The path of rays between collector 603 and the image of the light source 605 is guided via a plane mirror 620 which may comprise a first attenuator in accordance with the invention. A diaphragm 622 is arranged for this purpose in the plane of the first image of the light source 605.

The illumination system of the projection exposure system further comprises an optical system 650 for shaping and illuminating the field plane 700 with a ring-like field 690.1. The optical system 650 comprises two facet mirrors 654, 656 as a mixing unit for the homogeneous illumination of the field and a projection lens 658 with two projecting mirrors 662, 664 and a field-forming grazing-incidence mirror 670. Additional diaphragms 684, 688.1 and 688.2 for suppressing spill light are arranged in the optical system.

The first faceted mirror 654, the so-called field facet mirror, produces a plurality of secondary light sources in or close to the second faceted mirror 656, the so-called pupil facet mirror. The following projection lens consisting of the mirrors 662, 664 and 670 projects the pupil facet mirror into the exit pupil of the illumination system. The exit pupil of the illumination system coincidence in this case with the entrance pupil of the projection lens (not shown here). The angle of inclination of the individual facets of the first facet mirror 654 and the second facet mirror 656 are designed in such a way that the images of the individual field facets of the first facet mirror substantially overlap in the field plane 700 of the illumination system and thus a substantially homogenized illumination of the structure-bearing mask which comes to lie in this field plane is enabled. The segment of the ring field is formed via the field-forming grazing-incidence mirror 670 which is operated under the grazing incidence. If a grating in accordance with the invention for attenuating undesired radiation is situated on each pupil facet, virtual double images of the field are produced in the field plane 700 next to the field to be illuminated. The path of rays via a pupil facet 656.1 is shown as an example for this case. Pupil facet 656.1 projects the associated field facet 654.1 into the field 690.1. The impinging radiation is diffracted by the grating on the pupil facet 656.1, so that next to the field illumination 690.1 two further field illuminations 690.2 and 690.3 are produced according to the $1^{st}$ diffraction order. They are blocked by the additional diaphragms 684, 688.1 and 688.2 in such a way that the associated radiation cannot lead to an exposure of the light-sensitive substrate in the focal plane of the projection lens (not shown).

In this embodiment the gratings on the facet mirrors for example are designed in such a way that the diffraction orders come to lie virtually in the incidence plane, i.e. the grating vector lies in the incidence plane. To ensure that the $1^{st}$ diffraction orders 690.2 and 690.3 cannot overlap with the desired field 690.1 and thus can be separated completely, the diffraction angle must be chosen large enough. This can be calculated as follows: the distance between the pupil facet 656.1 and the associated field facet 654.1 is in this case approx. 1 m. The height of the field facet in the y direction is approx. 3 mm in this plane. The aperture of the radiation at the pupil facet is then 3 mrad. In order to separate the diffraction orders completely it is sufficient to choose the diffraction angle larger than the radiation aperture at the location of the pupil facet 656.1. The diffraction angle in the present case is therefore >3 mrad. If an incidence angle of 4 mrad is chosen for example for radiation higher than 130 nm, one obtains a required grating period of ≈32 μm. At an incidence angle of $\alpha_i \approx 5°$ an ideal grating depth of h ≈51 nm can be determined for this case from equation (5) in order to suppress radiation of the wavelengths between 130 nm and 330 nm. If the attenuator in accordance with the invention is used in the exemplary pupil facet mirrors 656 in combination with the attenuator on the plane mirror 620, another depth of e.g. h ≈90 nm can be advantageous in order to obtain the highest possible attenuation of the undesirable radiation over the spectrum of 130 nm to 330 nm.

FIG. 8*b* schematically shows the grating on the pupil facet mirror 656.1. The arrangement is preferably made in this case too by a binary grating, which is shown schematically by a number of grating grooves 655. It is understood that the attenuator in accordance with the invention can be applied in similar form also onto the field facets 654 or the further mirrors of the illumination system, including the collector 603.

The invention presents for the first time an optical attenuator for EUV lithography in particular which is characterized by high efficiency and is easy to produce.

It should be understood by a person skilled in the art that the disclosure content of this application comprises all possible combinations of any element(s) of any claims with any element(s) of any other claim, as well as combinations of all claims amongst each other.

What is claimed is:

1. An attenuator, comprising:
    a grating element having i) grating grooves that produce a grating period (p), and ii) a grating plane,
    wherein said grating period (p) is at least about 150 times greater than said used wavelength,
    wherein said grating element attenuates electromagnetic radiation of wavelengths unequal to said used wavelength,
    wherein said grating element is a binary grating and said grating grooves have a first height ($H_1$) and a second height ($H_2$) in a direction perpendicular to said binary grating,
    wherein said first height ($H_1$) and said second height ($H_2$) have a difference between them that defines a grating depth h,
    wherein said grating depth h is defined by the following equation:

$$\frac{\lambda_{min}}{4\cos\alpha} < h < \left(n + \frac{1}{2}\right)\frac{\lambda_{max}}{2\cos\alpha}, \text{ and}$$

wherein $\lambda_{min}$ is a shortest wavelength of wavelengths to be attenuated by said attenuator, $\lambda_{max}$ is a longest wavelength of said wavelengths to be attenuated by said attenuator, α is an incidence angle of a ray relative to a normal line of a surface of said grating element, and n is an integer number ≧0.

2. An illumination system for wavelengths <100 nn, comprising:
    a first attenuator having:
        a grating element having i) grating grooves that produce a grating period (p), and ii) a grating plane,
        wherein said grating period (p) is at least about 150 times greater than said used wavelength, and
        wherein said grating element attenuates electromagnetic radiation of wavelengths unequal to said used wavelength
    a second attenuator situated downstream from said first attenuator;
    a diaphragm in a diaphragm plane,
        wherein said diaphragm is situated downstream from said first attenuator in a path of rays from an object plane to a field plane, and
        wherein said diaphragm includes an opening at a location of a $0^{th}$ diffraction order of said at least one grating element; and a light source from which rays of a beam bundle pass through to said field plane,
wherein said rays impinge upon said first attenuator at an angle >70° to a normal line of a surface of said first attenuator, and
wherein said rays impinge upon said second attenuator at an angle <20° to a normal line of a surface of said second attenuator.

3. An illumination system comprising:
an object plane;
an image plane;
a light source emitting radiation of a used wavelength ≦100 nm and long-wavelength radiation of a wavelength >100 nm, the radiation propagating in a path of rays from the object to the image plane;
at least one attenuator with at least one grating element having grating grooves with a grating depth h;
at least one physical diaphragm in a diaphragm plane, which is situated downstream to the attenuator in the path of rays from the object plane to the image plane;
the physical diaphragm comprising an opening at a location of a $0^{th}$ diffraction order of the at least one grating element;
wherein the at least one grating element is arranged in the path of rays from the object plane to the image plane such that the $0^{th}$ diffraction order is passed through the diaphragm and long-wavelength radiation is diffracted at least partially to orders other than the $0^{th}$ order;
wherein said grating depth h is chosen to diffract the long-wavelength radiation with an optimal efficiency into orders other than the $0^{th}$ diffraction order; and
wherein the opening has a size and is chosen in such a way that the long-wavelength radiation of a wavelength larger than 10 times the used wavelength, which is diffracted at least partially by the at least one grating element of the attenuator into orders other than the $0^{th}$ order is blocked substantially completely by the diaphragm.

4. The illumination system of claim 3, wherein the diffraction into diffraction orders other than the $0^{th}$ order of the long wavelength radiation is wavelength dependent.

5. The illumination system of claim 4, wherein the diffraction of the long wavelength radiation in orders other than the $0^{th}$ order is characterized by a wavelength region and a mean diffraction efficiency calculated by averaging the diffraction efficiencies over the wavelength region.

6. The illumination system of claim 5, wherein the wavelength region is from 130 nm to 330 nm and the mean diffraction efficiency is in a range between 13% and 34%.

7. The illumination system of claim 5, wherein the wavelength region is from 130 nm to 600 nm and the mean diffraction efficiency is in a range between 8% and 29%.

8. The illumination system of claim 3, wherein the size of the opening of the physical diaphragm is chosen in such a way that also the radiation of the used wavelength which is diffracted by the at least one grating element of the attenuator into orders other than the $0^{th}$ diffraction passes through the diaphragm.

9. The illumination system of claim 3,
wherein the grating grooves produce at least one grating periodicity (p) and a grating plane, and
wherein the at least one grating periodicity (p) is at least 150 times greater than the used wavelength.

10. The illumination system of claim 3, wherein the grating element is a binary grating and the grating grooves have a different height in a direction perpendicular to the grating, with the grating grooves having a first height and a second height.

11. The illumination system of claim 10, wherein the difference between the first and second height defines the grating depth h and the grating depth is $$\frac{\lambda_{min}}{4\cos\alpha} < h < \left(n + \frac{1}{2}\right)\frac{\lambda_{max}}{2\cos\alpha}$$

with
h being the grating depth,
$\lambda_{min}$ being the shortest of the wavelengths to be attenuated by the attenuator,
$\lambda_{max}$ being the longest of the wavelengths to be attenuated by the attenuator,
α being the incidence angle of a ray relative to the normal line of the surface, and
n being an integer number ≧0.

12. The illumination system of claim 3, wherein the rays of a beam bundle impinge on the grating element at an angle <30° relative to a normal line of a surface which stands perpendicular to a grating plane.

13. The illumination system of claim 3, wherein the rays impinge on the grating element at an angle >70° relative to a normal line of a surface which stands perpendicular to a grating plane of the grating element.

14. The illumination system of claim 13, wherein the rays and the normal line of the surface define an incidence plane and a grating vector stands perpendicular to the incidence plane of the grating element, so that the grating grooves of the grating plane extend in a direction parallel to the direction of the rays impinging onto the grating element.

15. The illumination system of claim 3, wherein the grating element comprises a plurality of individual grating elements.

16. The illumination system of claim 15, wherein the individual grating elements comprise grating grooves of different grating depths.

17. The illumination system of claim 15, wherein said attenuator is a first attenuator, and said illumination system further comprises a second attenuator in said path, downstream of said first attenuator.

18. The illumination system of claim 17, wherein the rays of a beam bundle which propagate through the illumination system from the light source to the field plane impinge under an angle >70° to a normal line of the surface of the first attenuator, and the rays of a beam bundle which passes through the illumination system from the light source to the field plane impinge under an angle <20° to the normal line of the surface of at least one grating element of the second attenuator upon the second attenuator.

19. The illumination system as claimed in claim 3, further comprising a collector, wherein the attenuator is the first optical element in the path of rays from the light source to the field plane which is situated downstream the light source and the collector.

20. The illumination system of claim 3, further comprising a mixing unit with a first optical element with first facets, and a second optical element with second facets, wherein at least one of the two facets is arranged as an attenuator.

21. The illumination system of claim 20, further comprising further diaphragms downstream of the attenuator in the path of the rays from the light source to the field plane, wherein said further diaphragms include an opening at the location of the $0^{th}$ diffraction order of the at least one grating element of the attenuator.

22. A projection exposure system for producing microelectronic components, comprising:
the illumination system of claim 3;
a structure-bearing mask;
a projection lens; and
a light-sensitive object, wherein the structure-bearing mask is projected onto the light-sensitive object.

23. A method comprising: employing a projection exposure system to produce a microelectronic component, wherein said projection exposure system includes:
(A) an illumination system having:
an object plane;
an image plane;
a light source emitting radiation of a used wavelength 100 nm and long-wavelength radiation of a wavelength >100 nm, the radiation propagating in a path of rays from the object to the image plane;
at least one attenuator with at least one grating element having grating grooves with a grating depth h;
at least one physical diaphragm in a diaphragm plane, which is situated downstream to the attenuator in the path of rays from the object plane to the image plane;
the physical diaphragm comprising an opening at a location of a $0^{th}$ diffraction order of the at least one grating element;
wherein the at least one grating element is arranged in the path of rays from the object plane to the image plane such that the $0^{th}$ diffraction order is passed through the diaphragm and long-wavelength radiation is diffracted at least partially to orders other than the $0^{th}$ order
wherein said grating depth h is chosen to diffract the long-wavelength radiation with an optimal efficiency into orders other than the $0^{th}$ diffraction order; and
wherein the opening has a size and is chosen in such a way that the long-wavelength radiation of a wavelength larger than 10 times the used wavelength, which is diffracted at least partially by the at least one grating element of the attenuator into orders other than the $0^{th}$ order is blocked substantially completely by the diaphragm;
(B) a structure-bearing mask;
(C) a projection lens; and
(D) a light-sensitive object, wherein the structure-bearing mask is projected onto the light-sensitive object.

* * * * *